United States Patent
Do et al.

(10) Patent No.: US 11,011,818 B1
(45) Date of Patent: May 18, 2021

(54) TRANSFORMER HAVING SERIES AND PARALLEL CONNECTED TRANSMISSION LINES

(71) Applicant: Werlatone, Inc., Brewster, NY (US)

(72) Inventors: Ky-Hien Do, Carp (CA); Allen F. Podell, Palo Alto, CA (US); Mariama Dadhi Barrie, Brewster, NY (US)

(73) Assignee: Werlatone, Inc., Patterson, NY (US)

( * ) Notice: Subject to any disclaimer, the term of this patent is extended or adjusted under 35 U.S.C. 154(b) by 0 days.

(21) Appl. No.: 16/985,003

(22) Filed: Aug. 4, 2020

(51) Int. Cl.
*H01P 5/12* (2006.01)
*H03H 7/38* (2006.01)

(52) U.S. Cl.
CPC .................. *H01P 5/12* (2013.01); *H03H 7/38* (2013.01)

(58) Field of Classification Search
CPC ...................................... H01P 5/12; H03H 7/38
USPC ........................................................ 333/125
See application file for complete search history.

(56) References Cited

U.S. PATENT DOCUMENTS

| | | | |
|---|---|---|---|
| 2,470,307 A | 5/1949 | Guanella |
| 3,091,743 A | 5/1963 | Wilkinson |
| 3,103,638 A | 9/1963 | Greuet |
| 3,237,130 A | 2/1966 | Cohn |
| 3,239,781 A | 3/1966 | Podell |
| 3,262,075 A | 7/1966 | Podell |
| 3,311,850 A | 3/1967 | Podell |
| 3,325,587 A | 6/1967 | Sontheimer |
| 3,370,257 A | 2/1968 | Spierling |
| 3,399,340 A | 8/1968 | Podell |
| 3,428,886 A | 2/1969 | Kawashima |
| 3,484,724 A | 12/1969 | Podell |
| 3,508,171 A | 4/1970 | Podell |
| 3,516,025 A | 6/1970 | Podell |
| 3,529,265 A | 9/1970 | Podell |
| 3,614,676 A | 10/1971 | Boelke |
| 3,629,733 A | 12/1971 | Podell |
| 3,761,843 A | 9/1973 | Cappucci |
| 3,883,828 A | 5/1975 | Cappucci |

(Continued)

FOREIGN PATENT DOCUMENTS

| | | |
|---|---|---|
| CA | 742816 A | 9/1966 |
| EP | 0997965 A1 | 3/2000 |

OTHER PUBLICATIONS

G.D. Monteath; "Coupled Transmission Lines as Symmetrical Directional Couplers"; Proc. IEE, vol. 102, Part B, No. 3, pp. 383 through 392; May 1955; 10 pages.

(Continued)

*Primary Examiner* — Robert J Pascal
*Assistant Examiner* — Kimberly E Glenn
(74) *Attorney, Agent, or Firm* — Kolisch Hartwell, P.C.

(57) ABSTRACT

First ends of a plurality of sub-networks of an exemplary transmission-line network are connected together electrically in series. First ends of a plurality of transmission lines of one subnetwork are connected together in parallel and second ends are connected together in series. The one sub-network has a first-end impedance value that is different than a second-end impedance value. The second-end impedance value of the one sub-network is different than a second-end impedance value of another sub-network. A respective transmission line connects each sub-network to a common circuit node and a respective resistor interconnects each adjacent pair of the second ends of the sub-networks.

18 Claims, 5 Drawing Sheets

(56) References Cited

U.S. PATENT DOCUMENTS

| | | |
|---|---|---|
| 3,980,972 A | 9/1976 | Podell et al. |
| 3,988,705 A | 10/1976 | Drapac |
| 4,011,528 A | 3/1977 | Podell et al. |
| 4,129,838 A | 12/1978 | Wallington |
| 4,222,016 A | 9/1980 | Stock et al. |
| 4,263,559 A | 4/1981 | Ho |
| 4,395,670 A | 7/1983 | Podell |
| 4,554,518 A | 11/1985 | Baer |
| 4,556,856 A | 12/1985 | Presser |
| 4,626,806 A | 12/1986 | Rosar et al. |
| 4,636,755 A | 1/1987 | Gibbs |
| 4,647,866 A * | 3/1987 | Brown ............... H03F 3/26 330/146 |
| 4,721,929 A | 1/1988 | Schnetzer |
| 4,800,345 A | 1/1989 | Podell et al. |
| 4,825,220 A | 4/1989 | Edward et al. |
| 4,851,795 A | 7/1989 | Beckwith |
| 4,916,410 A | 4/1990 | Littlefield |
| 4,937,541 A | 6/1990 | Podell et al. |
| 5,008,639 A | 4/1991 | Pavio |
| 5,121,090 A | 6/1992 | Garuts et al. |
| 5,206,611 A | 4/1993 | Russell |
| 5,285,175 A * | 2/1994 | Edwards ............. H03F 3/602 333/109 |
| 5,296,823 A | 3/1994 | Dietrich |
| 5,304,959 A | 4/1994 | Wisherd et al. |
| 5,352,994 A | 10/1994 | Black et al. |
| 5,697,088 A | 12/1997 | Gu |
| 5,847,625 A | 12/1998 | Gillette |
| 5,889,444 A | 3/1999 | Johnson et al. |
| 5,926,076 A | 7/1999 | Johnson et al. |
| 5,977,842 A | 11/1999 | Brown et al. |
| 5,982,252 A | 11/1999 | Werlau |
| 6,130,588 A | 10/2000 | Gallivan et al. |
| 6,150,897 A | 11/2000 | Nishikawa et al. |
| 6,236,272 B1 | 5/2001 | Takei et al. |
| 6,246,299 B1 | 6/2001 | Werlau |
| 6,285,273 B1 | 9/2001 | Morikawa |
| 6,294,965 B1 | 9/2001 | Merrill et al. |
| 6,300,848 B1 | 10/2001 | Miyaji et al. |
| 6,407,648 B1 | 6/2002 | Johnson |
| 6,472,950 B1 | 10/2002 | London |
| 6,570,466 B1 | 5/2003 | Bahl |
| 6,750,752 B2 | 6/2004 | Werlau |
| 6,756,874 B2 | 6/2004 | Buckles et al. |
| 6,819,200 B2 | 11/2004 | Zhao et al. |
| 6,822,531 B2 | 11/2004 | Carlson |
| 6,914,512 B2 | 7/2005 | Park et al. |
| 6,972,639 B2 | 12/2005 | Podell |
| 6,982,609 B1 | 1/2006 | McKay et al. |
| 7,042,309 B2 | 5/2006 | Podell |
| 7,068,122 B2 | 6/2006 | Weng et al. |
| 7,132,906 B2 | 11/2006 | Podell |
| 7,138,887 B2 | 11/2006 | Podell |
| 7,142,052 B2 | 11/2006 | Zelley |
| 7,190,240 B2 | 3/2007 | Podell |
| 7,202,760 B2 | 4/2007 | Podell |
| 7,245,192 B2 | 7/2007 | Podell |
| 7,274,267 B2 | 9/2007 | Saitou et al. |
| 7,345,557 B2 | 3/2008 | Podell |
| 7,663,449 B2 | 2/2010 | Podell |
| 7,692,512 B2 | 4/2010 | Podell |
| 7,801,493 B2 | 9/2010 | Do |
| 7,839,232 B2 | 11/2010 | London |
| 8,248,180 B2 | 8/2012 | Podell |
| 8,248,181 B2 | 8/2012 | Podell |
| 8,482,362 B1 | 7/2013 | Podell |
| 8,493,162 B1 | 7/2013 | Podell |
| 8,570,116 B2 | 10/2013 | Podell |
| 8,598,964 B2 | 12/2013 | Podell |
| 8,648,669 B1 | 2/2014 | Podell |
| 8,704,611 B2 | 4/2014 | Podell et al. |
| 9,325,051 B1 | 4/2016 | Podell et al. |
| 10,224,895 B2 * | 3/2019 | Leoni ............... H03H 7/42 |
| 2008/0018412 A1 | 1/2008 | Podell |

OTHER PUBLICATIONS

C.W. Gerst; "Electrically Short 90° Couplers Utilizing Lumped Capacitors"; Microwave Symposium Digest, G-MTT International vol. 67, Issue 1, pp. 58 through 62; May 1967; 5 pages.

Cohn, Seymour B. "A Class of Broadband Three-Port TEM-Mode Hybrids." IEEE Transactions on Microwave Theory and Techniques. vol. MTT-16, No. 2. Feb. 1968, pp. 110-116.

Nagai, N., et al. "New n-Way Hybrid Power Dividers." Microwave Symposium Digest, 1977, IEEE MTT-S International Digital Object Indentifier. 1977, pp. 503-505.

Kenneth J. Russell; "Microwave Power Combining Techniques"; IEEE Transactions on Microwave Theory and Techniques vol. MTT-27 No. 5 pp. 472 through 478; May 1979; 7 pages.

Valerie Illingworth, editor; Definition of the word "balun"; The Penguin Dictionary of Electronics p. 30, Second Edition; Copyright 1988 Penguin Books; 2 pages.

Paul Horowitz et al.; "Stubs, baluns, and transformers"; The Art of Electronics section 13.10, pp. 881 through 882, Second Edition; Copyright 1989 Cambridge University Press; 4 pages.

Hongming An, et al; "A 50:1 Bandwidth Cost-Effective Coupler with Sliced Coaxial Cable"; IEEE MTT-S Digest, 1996; 4 pages.

Angelos Alexanian; "Planar and Distributed Spatial Power Combiners" doctoral dissertation; University of California Santa Barbara; Jun. 1997; 119 pages.

Rogers Corporation; "RT/duroid 5870/5880 High Frequency Laminates" data sheet; copyright 1989 through 2006 Rogers Corporation (Revised Nov. 2006); 2 pages.

Nai-Shuo Cheng et al; "A 120-W X-Band Spatially Combined Solid-State Amplifier"; IEEE Transactions on Microwave Theory and Techniques vol. 47 No. 12 pp. 2557 through 2561; Dec. 1999; 5 pages.

Jerry Sevick; "A Simplified Analysis of the Broadband Transmission Line Transformer"; High Frequency Electronics; Feb. 2004; four pages.

Chris Trask; "A Tutorial on Transmission Line Transformers"; Sonoran Radio Research, Tempe, Arizona; Revised Aug. 14, 2005; seven pages.

Trask, Transmission Line Transformers: Theory, Design and Applications—Part 1, High Frequency Electronics, 2005, 6 pages, Summit Technical Media.

Park, Ung-Hee, et al. "A 700- to 2500-MHz Microstrip Balun Using a Wilkinson Divider and 3-dB Quadrature Couplers." Microwave and Optical Technology Letters. vol. 47, No. 4. Nov. 20, 2005, pp. 333-335.

Trask, Transmission Line Transformers: Theory, Design and Applications—Part 2, High Frequency Electronics, 2006, 5 pages, Summit Technical Media.

H.T. Kim, et al; "Ultra-wideband uniplanar MMIC balun using field transformations"; Electronics Letters vol. 42 No. 6; Mar. 16, 2006; 2 pages.

Microwave Encyclopedia—Microwaves101.com; "Baluns" web page; http://www.microwaves101.com/encyclopedia/baluns.cfm; updated Nov. 28, 2006 and downloaded Aug. 1, 2007; 3 pages.

The Southgate Amateur Radio Club, byline given as "G8MNY"; "Techtip: Coax Balun" web page; downloaded from www.southgatearc.org on Aug. 3, 2007; 2 pages.

Harty, Daniel D. "Novel Design of a Wideband Ribcage-Dipole Array and its Feeding Network." Thesis Submitted to the Faculty of the Worcester Polytechnic Institute, Dec. 17, 2010, 106 pages.

* cited by examiner

TRANSFORMER HAVING SERIES AND PARALLEL CONNECTED TRANSMISSION LINES

FIELD

This disclosure relates to transmission-line networks. More specifically, the disclosed embodiments relate to circuits and methods for transforming operating characteristics, such as voltage or impedance values, with transmission-lines connected in a combination of series and parallel configurations.

BACKGROUND

A pair of conductive lines, such as a signal conductor and a signal-return conductor, are coupled when they are spaced apart, but spaced closely enough together for energy flowing in one to be induced in the other. Transmission-line networks, such as impedance-transforming combiners (including dividers) and transformers, typically include such coupled lines as transmission lines, but may be restricted to limited frequency ranges of operation due to resonance inherently in their topologies.

For certain applications, there is a need for a broadband, high power communication system. For example, in military applications a broad bandwidth is required for secure spread spectrum communication and high power is required for long range. High power broadband communication systems require high power broadband antennas. Often these antennas have an input impedance that does not match the desired transmitter or receiver with which it is used. In such circumstances, impedance transformers can be used to transform the impedance of the antenna to the impedance of the transmitter or receiver.

Transmission-line-based impedance transformers may be used for matching networks for antennas and amplifiers operating at radio frequencies, such as frequencies in the HF and VHF bands. They are also known for having low losses, which makes them especially useful in high power circuits. Transmission-line-based impedance transformers may be made using various structures, such as parallel wires, coaxial cables, or twisted wire pairs.

SUMMARY

Radio-frequency transmission-line networks having transmission-line sub-networks coupled to combining transmission lines are described. In some embodiments, first ends of a plurality of transmission-line sub-networks are connected together electrically in series. First ends of a plurality of transmission lines of one subnetwork are connected together in parallel and second ends are connected together in series. The one sub-network has a first-end impedance value that is different than a second-end impedance value. The second-end impedance value of the one sub-network is different than a second-end impedance value of another sub-network. A respective transmission line connects each sub-network to a common circuit node and a resistor interconnects adjacent pairs of the second ends of the sub-networks.

In some embodiments, a radio-frequency transmission-line network connecting a first circuit node to a second circuit node comprises a plurality of sub-networks having first and second ends, a respective combining transmission line connecting each sub-network to the second circuit node, and a respective resistor interconnecting second ends of each pair of adjacent subnetworks. Each sub-network has at least one sub-network transmission line. The first ends of the plurality of sub-networks are connected directly together electrically in series from the first circuit node. At least one sub-network of the plurality of sub-networks includes a plurality of sub-network transmission lines, including the respective at least one sub-network transmission line, connected together in parallel at the first ends of the sub-network transmission lines associated with the first end of the one sub-network and connected together in series at second ends of the sub-network transmission lines associated with a second end of the one sub-network. The at least one sub-network has a first-end impedance value that is different than a second-end impedance value of the at least one sub-network, and the second-end impedance value of the at least one sub-network is different than a second-end impedance value of another sub-network of the plurality of sub-networks.

In some embodiments, a transmission-line network may include a plurality of sub-networks and a combiner coupled to the transmission-line subnetworks. The radio-frequency transmission-line network extends between first and second circuit nodes. Each sub-network has at least one sub-network transmission line and the combiner connects the plurality of sub-networks to the second circuit node.

The plurality of sub-networks may include a first sub-network having a first sub-network transmission line and a last sub-network having a last sub-network transmission line. In this example, each sub-network has a respective first end proximate to the first circuit node with a first-end impedance value and a respective second end proximate to the second circuit node with a second-end impedance value.

Each transmission line in each sub-network has a respective characteristic impedance value, a respective length corresponding to a quarter wavelength of a circuit operating radio frequency of the transmission-line network, a first end associated with the first end of the associated sub-network, a second end associated with the second end of the associated sub-network, a signal conductor, and a signal-return conductor. The first circuit node is directly connected to the signal conductor at the first end of the first sub-network transmission line.

The plurality of sub-networks are configured in an order defined by relative positions of the first ends of the plurality of sub-networks between the first sub-network and the last sub-network. The first ends of the plurality of sub-networks are connected directly together electrically in series between the first circuit node and the first end of the last sub-network.

At least one sub-network of the plurality of sub-networks includes a plurality of sub-network transmission lines, including the at least one sub-network transmission line, connected together in parallel at the first ends of the sub-network transmission lines and connected directly together in series at the second ends of the sub-network transmission lines. The at least one sub-network has a first-end impedance value that is different than the second-end impedance value of the at least one sub-network. The second-end impedance value of the at least one sub-network is different than the second-end impedance value of another sub-network of the plurality of sub-networks.

The combiner connects the plurality of sub-networks to the second circuit node. The combiner includes a respective combining transmission line connecting each sub-network of the plurality of sub-networks to the second circuit node and a resistor interconnecting each pair of second ends of the plurality of sub-networks that are adjacent in the order of the plurality of the sub-networks.

In some embodiments, a radio-frequency transmission-line network comprises first, second, third, fourth, and fifth transmission lines and a resistor. Each of the first, second, and third transmission lines has a first end proximate to a first circuit node, a second end proximate to a second circuit node, a length corresponding to a quarter wavelength of a circuit operating radio frequency of the transmission-line network, a signal conductor, and a signal-return conductor. The first circuit node is coupled to the signal conductor at the first end of the first transmission line. The signal-return conductor at the first end of the first transmission line is connected to the signal conductors at the first ends of both of the second and third transmission lines. The signal-return conductor at the second end of the second transmission line is connected to the signal conductor at the second end of the third transmission line.

The fourth transmission line is connected between the first transmission line and the second circuit node. The signal conductor at a first end of the fourth transmission line is connected to the signal conductor at the second end of the first transmission line. The signal conductor at a second end of the fourth transmission line is connected to the second circuit node. The fifth transmission line is connected between the second transmission line and the second circuit node. A signal conductor at a first end of the fifth transmission line is connected to the signal conductor at the second end of the second transmission line. The signal conductor at a second end of the fifth transmission line is connected to the second circuit node. The resistor has one end connected to the second end of the first transmission line and another end connected to the second end of the second transmission line.

In some embodiments, the first, second, and third transmission lines have characteristic impedance values that are the same and the signal-return conductor of the third transmission line is connected to a circuit ground. The fourth transmission line has a characteristic impedance value that is different than the characteristic impedance value of the first transmission line. The fifth transmission line has a characteristic impedance value that is higher than the characteristic impedance value of the second transmission line. The resistor connecting the second ends of the first and second transmission lines has a resistance value that is less than the characteristic impedance value of the first transmission line. A second resistor interconnects the second end of the third transmission line with the second end of the second transmission line, and has a resistance value that is more than ten times the characteristic impedance value of the third transmission line.

Features, functions, and advantages may be achieved independently in various embodiments of the present disclosure, or may be combined in yet other embodiments, further details of which can be seen with reference to the following description and drawings.

DESCRIPTION

Overview

Various embodiments of a transmission-line network having a plurality of sub-networks and transmission lines coupling the sub-networks to a common circuit node are described below and illustrated in the associated drawings. Unless otherwise specified, a transmission-line network and/or its various components may, but are not required to, contain at least one of the structure, components, functionality, and/or variations described, illustrated, and/or incorporated herein. Furthermore, the structures, components, functionalities, and/or variations described, illustrated, and/or incorporated herein may, but are not required to, be included in other transmission-line networks. The following description of various embodiments is merely exemplary in nature and is in no way intended to limit the disclosure, its application, or uses. Additionally, the advantages provided by the embodiments, as described below, are illustrative in nature and not all embodiments provide the same advantages or the same degree of advantages.

In the designs of RF and microwave components, there are instances that a circuit node is formed by merging two similar transmission lines together. The circuit node thus takes on a characteristic impedance value equal to half that of each of the original transmission lines. The new circuit node is termed a T-junction and normally its bandwidth performance is quite modest.

In particular, in the designs of impedance-transforming combiners and transformers, there are instances that a circuit node is formed by such a T-junction. Furthermore, due to manufacturing tolerances and asymmetrical layouts, the performance of such combiners and transformers may be marred by a pronounced and persistent resonance at a frequency having a quarter wavelength equal to the length of each of the original transmission lines. As such, the upper ends of the operational bandwidths of pre-existing combiners and transformers are limited by these quarter wavelength resonances.

However, by joining transmission lines in a transmission-line network with a resistive junction as disclosed herein, the effects of the quarter-wave resonance may be significantly reduced. For example, the quarter-wave resonance may be reduced to a point that it no longer adversely impacts the insertion or return loss responses excessively. As a result, the bandwidth performance of such combiners and transformers may be improved extensively.

For example, a resistive junction may be included in a transmission-line network to overcome resonance due to series-parallel connections of transmission lines in the transmission-line network. Resistive junctions, such as those disclosed herein, may in some cases be useful when deployed in conjunction, for example, with a series-parallel transmission line transformer, balun, combiner, or other circuit.

Transmission lines disclosed herein may be constructed as one of various forms well known in the art. For example, a transmission line may be a coaxial transmission line, twisted pair, stripline, coplanar waveguide, slot line, or microstrip line. Whatever the form, each transmission line may include a pair of electrically spaced apart, inductively coupled conductors that conduct or transmit a signal defined by a voltage difference between the conductors. These conductors may be described interchangeably as a signal conductor and a signal-return conductor. The impedances and lengths of these transmission lines may be varied to fine-tune the operating performance of the overall transmission-line network.

Definitions

"Node" refers to a point on an electrical circuit where a characteristic of the circuit may be identified. A node is typically a point in a circuit between circuit components. A port or a terminal is considered a node of a circuit structure that provides external access or connection, or represents an end of a circuit component or structure.

Two elements are considered "coupled" when they are in such relation that the performance of one element influences the performance of the other by energy transfer by electrical conduction (involving electron flow), electromagnetic induction (such as inductive coupling or capacitive coupling), or electromagnetic radiation. Coupling includes being connected, either permanently or releasably, whether directly or indirectly through intervening components, and is not necessarily limited to physical connection(s). Electromagnetically coupled elements have energy transfer by electromagnetic induction, such as is provided by inductive coupling or capacitive coupling rather than electrical conduction.

Two spaced-apart conductive lines are inductively coupled or electromagnetically coupled when they are spaced closely enough together for energy flowing in one to be induced in the other electromagnetically and/or electrostatically. The amount of energy flowing between the lines is related to the dielectric and magnetic media the conductors are in and the spacing between the lines. Even though electromagnetic fields surrounding the lines are theoretically infinite, lines are often referred to as being closely or tightly coupled, loosely coupled, or uncoupled, based on the relative amount of coupling. The amount of coupling may be defined by a coupling coefficient. However, as a practical measure, two lines may be considered to be inductively coupled when a detectable signal is coupled from one line onto the other. A threshold of coupling may be appropriate to distinguish between coupled and uncoupled lines. In most applications, two lines that have less than 20 dB inductive coupling between them are considered to be uncoupled lines. In some applications, lines that have less than 100 dB are considered to be uncoupled lines. In terms of a coupling coefficient, two lines may be considered to be electromagnetically closely coupled if the coupling coefficient is greater than 0.1. For purposes of the following description, two lines, including inductors that are electromagnetically closely coupled are also referred to as a coupler. Thus, two lines may be considered as loosely coupled or substantially uncoupled if they have a coupling coefficient of less than 0.1.

Two conductors are electrically connected when there is an electron current path between them, including any conductors and electron-conductive electrical elements, such as resistors, and inductors, but not coupling by either electromagnetic induction such as inductive coupling or capacitive coupling, or electromagnetic radiation, such as radio waves and microwave power transmission. Two conductors or other components may be directly electrically connected when there are no intervening electrical elements. Electrical components connected in series conduct a common current sequentially through the electrical components. Electrical components connected exclusively in series conduct only a common current sequentially through the electrical components. Electrical components connected in parallel have a common voltage across the electrical components. Electrical components connected in exclusively in parallel are connected between the same circuit nodes and have only the same voltage across each of the electrical components.

Ordinal terms such as "first", "second", and "third" are used to distinguish or identify various members of a group, or the like, in the order they are introduced in a particular context and are not intended to show serial or numerical limitation, or be fixed identifiers for the group members. Accordingly, the ordinal indicator used for a particular element may vary in different contexts.

Where "a" or "a first" element or the equivalent thereof is recited, such usage includes one or more such elements, neither requiring nor excluding two or more such elements.

Examples, Components, and Alternatives

The following sections describe selected aspects of exemplary transmission-line networks as well as related systems and/or methods. The examples in these sections are intended for illustration and should not be interpreted as limiting the scope of the included features. Each section may include one or more distinct inventions, and/or contextual or related information, function, and/or structure.

Example 1

Figure 1:
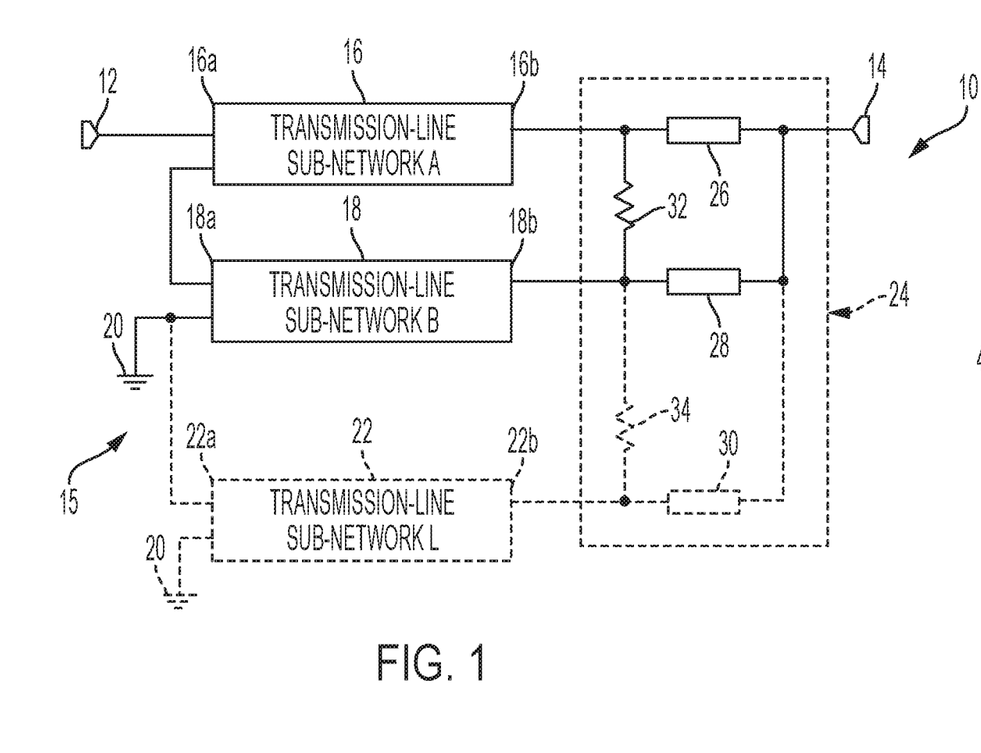
FIG. 1 is a block diagram showing an exemplary transmission-line network.

Referring to FIG. 1, a transmission-line network, shown generally at 10, connects a first circuit node 12 to a second circuit node 14. A transmission-line sub-network assembly 15 includes plurality of transmission-line sub-networks having first ends connected in series relative to the first circuit node and second ends proximate to the second circuit node. In this example, a first transmission-line sub-network 16, shown as transmission-line sub-network A, has a first end 16a connected to the first circuit node and an opposite second 16b. A second transmission-line sub-network 18, shown as a transmission-line sub-network B, has a first end 18a connected in series with the first end of sub-network 16 from the first circuit node and a second end 18b proximate to the second circuit node. The second sub-network is considered the last sub-network in transmission-line network 10 and is connected to a circuit reference potential 20, shown as a circuit ground. In this example, the first circuit node may be considered to be an input circuit node and the second circuit node the output circuit node. However, the transmission-line network may conduct signals in either direction, so the second circuit node may also function as the input circuit node with the first circuit node an output circuit node.

There may be more than two transmission-line sub-networks in transmission-line sub-network assembly 15. For example, a transmission-line network may include a third transmission-line sub-network 22, shown in dashed lines as transmission-line sub-network L. Transmission-line sub-network 22 has a first end 22a connected in series with first end 18a of transmission-line sub-network 18 and a second end 22b proximate to second circuit node 14. In examples where there are intervening sub-networks between sub-networks 18 and 22, the series of sub-networks are connected in series from the first circuit node as is represented by the dashed interconnecting lines between the sub-networks. The last sub-network in the series is connected to circuit reference potential 20. The plurality of sub-networks may be considered to be configured in an order defined by relative positions of the first ends of the plurality of sub-networks between the first sub-network and the last sub-network.

Each subnetwork preferably is connected to the second circuit node via a respective combining transmission line. The set of combining transmission lines may be included in what is referred to generally as a combiner 24. Combiner 24 may also function as a divider when the second circuit node is the input circuit node. In this example, sub-network 16 is connected to second circuit node 14 via a combining transmission line 26. Similarly, sub-network 18 is connected to the second circuit node via a combining transmission line 28. This configuration applies to each of the sub-networks. Thus, in an example including a further sub-network 22, sub-network 22 is connected to the second circuit node via a combining transmission line 30. The set of combining transmission lines thus connect the outputs of the sub-networks to a common output circuit node.

Further, a respective isolating inter-sub-network resistor interconnects second ends of pairs of electrically adjacent sub-networks and/or interconnects first ends of pairs of electrically adjacent combining transmission lines. Two sub-networks may be considered electrically adjacent if respective first ends are connected to a common circuit node or if, as in this case, respective second ends are connected to corresponding ends of an electrical component, such as an isolating inter-sub-network resistor. In other words, there is an isolating inter-sub-network resistor interconnecting each pair of second ends of the plurality of sub-networks that are adjacent in the order of the plurality of the sub-networks between the first sub-network and the last sub-network. Accordingly, an isolating inter-sub-network resistor 32 interconnects second ends 16*b* and 18*b* of respective adjacent sub-networks 16 and 18. In an example including a further sub-network 22, an isolating inter-sub-network resistor 34 interconnects second ends 18*b* and 22*b* of respective adjacent sub-networks 18 and 22. In an example having more than three sub-networks, respective isolating inter-sub-network resistors interconnect the second ends of those additional pairs of adjacent sub-networks.

Figure 2:
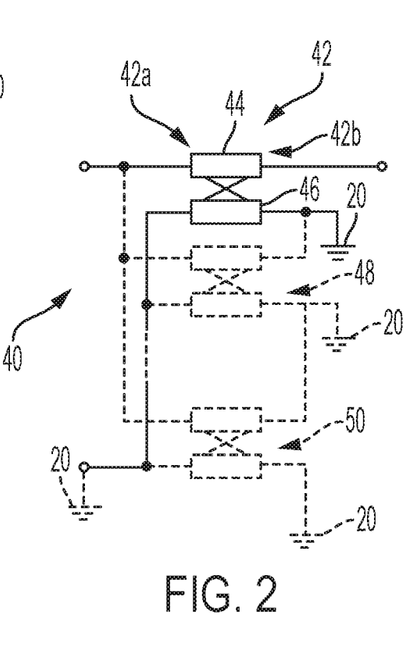
FIG. 2 is a schematic diagram of a generalized example of a sub-network that may be included in the transmission-line network of FIG. 1.

Referring now to FIG. 2, a generic sub-network 40 is illustrated. Sub-network 40 may be any of sub-networks 16, 18, or 22, or other subnetwork of transmission-line network 10 shown in FIG. 1. Each sub-network has at least one sub-network transmission line, such as a transmission line 42. As mentioned previously, a transmission line includes a signal conductor and a signal-return conductor that are closely coupled. In this example, transmission line 42 includes a signal conductor 44 closely coupled to a signal-return conductor 46. If sub-network 40 includes only transmission line 42, then the signal conductor is connected to a circuit node at a first end 42*a* of the transmission line and the other end 42*b* of the signal conductor serves as an output of the sub-network. Input end 42*a* of the signal conductor thus may be connected to circuit node 12 where the transmission-line sub-network is the first transmission-line sub-network or to an intermediate transmission-line sub-network. Opposite ends of signal-return conductor 46 are connected to circuit ground 20.

At least one sub-network of the plurality of sub-networks includes a plurality of sub-network transmission lines, including the respective at least one sub-network transmission line 42 and one or more further sub-network transmission lines, such as a sub-network transmission line 48 shown in dashed lines. If sub-network 40 has a plurality of transmission lines, then the sub-network includes at least transmission lines 40, 48, and may include one or more additional transmission lines, such as an optional third transmission line 50, also shown in dashed lines. There may be one or more additional transmission lines between transmission lines 48, 50, not shown. The number of transmission lines in a sub-network depends on the appropriate configuration for achieving desired impedance levels for the sub-network relative to the other transmission line sub-network or sub-networks. More than one of the transmission line sub-networks in a transmission line sub-network assembly may include a plurality of transmission lines.

The first ends of the plurality of transmission lines within a sub-network are preferably connected together in parallel. The second ends of the plurality of transmission lines are connected together in series. More specifically, the input or first ends of the signal conductors of the respective transmission lines are directly connected together. Additionally, the input or first end of each of the signal-return conductors is connected to circuit ground 20.

The second end of the signal-return conductor of each transmission line is directly connected to the second end of the signal line of the next succeeding and adjacent transmission line within the transmission line sub-network. The second end of the signal-return conductor of the last transmission line in the series of series-connected transmission lines is connected to circuit ground 20. Thus, in the example in which sub-network 40 has only a single transmission line, i.e., transmission line 42, then the second end of signal-return conductor 46 is connected to circuit ground, as previously described. In the example in which sub-network 40 includes only transmission lines 42, 48, then the second ends of transmission lines 42, 48 are connected in series. Accordingly, the second end of the signal-return conductor 46 of transmission line 42 is not connected to circuit ground, but instead is connected to the second end of the signal conductor of transmission line 48. The second end of signal-return conductor of transmission line 48, being the last transmission line in the series of transmission lines in sub-network 40, is connected to circuit ground.

This series connection configuration of the second ends of the transmission lines within sub-network 40 is provided for the series of transmission lines within the transmission line sub-network. Thus, in the example of sub-network 40 having three transmission lines, the last transmission line in the series is transmission line 50. In this case, the second end of the signal-return conductor of transmission line 50 is connected to circuit ground.

The subnetworks each have an impedance value at the first end and a corresponding impedance value at the second end. The first-end impedance value may be the same or different than the second-end impedance value. For example, a subnetwork that consists of a single transmission line has first-end and second-end impedance values that both equal the characteristic impedance of the transmission line. Different sub-networks may have different first-end and second-end impedance values.

Similarly, a sub-network may have a configuration that is characterized by a first-end impedance value that is different than the second-end impedance value. The plurality of transmission lines included in a sub-network have the first-ends connected together in parallel and the second ends are connected in series. This may result in a first-end impedance value that is different than the second-end impedance value. When the individual transmission lines have the same individual characteristic impedances, the first-end impedance value of the associated transmission line sub-network is different than the second-end impedance value. The second-end impedance value of a sub-network with a plurality of transmission lines may also be different than a second-end impedance value of another sub-network of the plurality of sub-networks depending on the respective configurations and impedance values of the associated transmission lines.

Example 2

Figure 3:
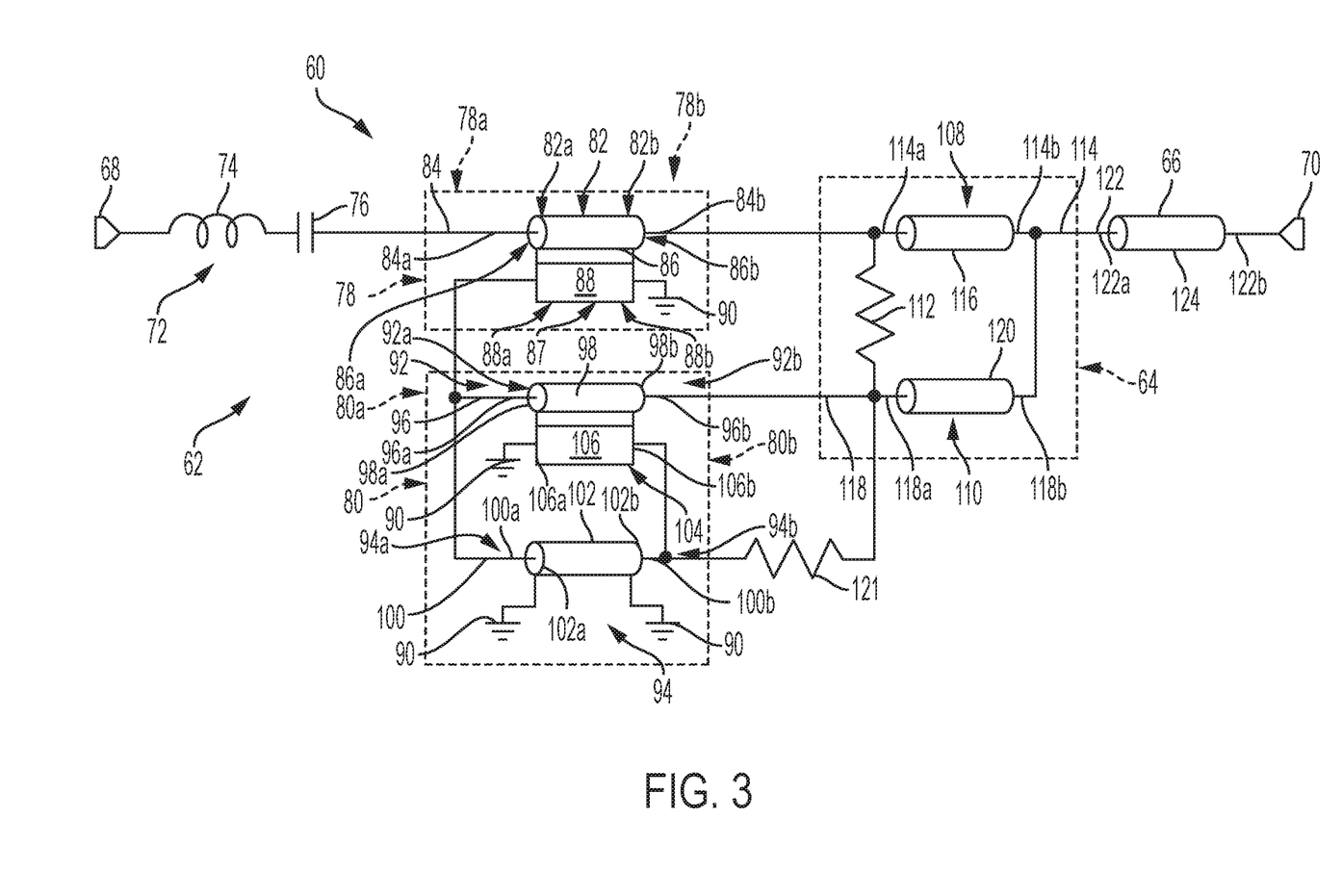
FIG. 3 is a schematic diagram of an example of a transmission-line network according to FIGS. 1 and 2.

An example of a transmission line network 10 is shown generally at 60 in FIG. 3. Transmission-line network 60 includes a transmission-line sub-network assembly 62, a combiner 64, and a transmission line 66 connected collectively in series between an input circuit node 68 and an output circuit node 70.

In this example, transmission-line network 60 further includes an input LC band-pass filter 72. For operation between about 0.1 GHz and 4.0 GHz, filter 72 includes an inductor 74 having an inductance of 0.2 nH and a capacitor 76 having a capacitance of 9.958 pF.

Transmission-line sub-network assembly 62 includes a first transmission-line sub-network 78 and a second transmission-line sub-network 80. Transmission-line sub-networks 78 and 80 are examples of generic transmission-line sub-network 40 illustrated in FIG. 2. The ends of the transmission-line sub-networks, associated transmission lines, and associated conductors, proximate to circuit node 68 are referred to a first ends and the ends proximate to circuit node 70 are referred to as second ends. Transmission-line sub-network 78 includes a single transmission line 82 that is shown as a coaxial transmission line having a center, signal conductor 84 and an outer or shield, signal-return conductor 86. First end 84a of signal conductor 84 is connected to input circuit node 68 via filter 72 and first end 86a of signal-return conductor 86 is connected to first end 80a of transmission-line sub-network 80.

A transmission line 87 includes a signal conductor 88 connected at opposite first and second ends 88a, 88b to corresponding respective ends 86a, 86b of signal-return conductor 86. In this example, transmission line 87 has an impedance value of 60 ohms. Signal-return conductor 86 and signal conductor 88 are connected electrically in parallel. Second ends 86b and 88b of signal-return conductor 86 and the signal conductor 88 of transmission line 87 are connected to a circuit ground 90. In this example, transmission line 82 preferably has an impedance value of 31.65 ohms. Transmission line 88 preferably has a length corresponding to a quarter-wavelength at a design operating frequency and has an impedance value of 60 ohms. Since transmission line 87 is in parallel with outer shield signal-return conductor 86 of transmission line 82, it reduces the inductance of transmission line 82 by offsetting inductance of the outer shield signal-return conductor.

Transmission-line sub-network 80 includes transmission lines 92, 94 shown as coaxial transmission lines, preferably having impedance values of 31.65 ohms. Transmission line 92 includes a center signal conductor 96 and an outer shield signal-return conductor 98. Transmission line 94 includes a center signal conductor 100 and an outer shield signal-return conductor 102. First ends 96a and 100a of these signal conductors are connected together and to end 86a of signal-return conductor 86 of transmission line 82 of transmission-line sub-network 78. The input ends of transmission lines 92, 94 are thus connected in parallel and the input ends of transmission line sub-networks 78, 80 are connected in series.

A transmission line 104 includes a signal conductor 106 connected at opposite first and second ends 106a, 106b to corresponding respective ends 98a, 98b of signal-return conductor 98. In this example, transmission line 104 has a length corresponding to a quarter-wavelength at a design operating frequency and an impedance value of 60 ohms. Signal-return conductor 98 and signal conductor 106 are connected electrically in parallel. Respective first ends 98a and 106a of signal-return conductor 98 and signal conductor 106 are connected to circuit ground 90. In this example, transmission line 92 preferably has an impedance value of 31.65 ohms. Transmission line 104 preferably has an impedance value of 60 ohms, and since it is in parallel with signal-return conductor 98, reduces the inductance of transmission line 92 by offsetting inductance of shield signal-return conductor 98.

Second end 98b of transmission line 92 and second end 106b of signal conductor 106 are connected to second end 100b of signal line 100 of transmission line 94. First and second ends 102a, 102b of outer shield signal-return conductor 102 are connected to circuit ground 90. It will be appreciated, then, that the second ends of transmission lines 92, 94 are connected from second end 96b of center signal conductor 96 of transmission line 92 in series to ground at second end 102b of outer signal-return conductor 102 of transmission line 94.

Combiner 64 is an example of a combiner 24 having two combining transmission lines 108, 110, shown as coaxial transmission lines, and an isolating inter-sub-network resistor 112. Transmission line 108 preferably has an impedance value of 39.805 ohms and transmission line 110 preferably has an impedance value of 43.225 ohms for operation over the design frequency range. Resistor 112 preferably has an impedance value of 5 ohms. Transmission line 108 includes a center signal conductor 114 and an outer shield signal-return conductor 116. An end 114a of signal conductor 114 is connected to one end of resistor 112 and to second end 84b of center signal conductor 84 of transmission line 82. Transmission line 110 includes a center signal conductor 118 and an outer shield signal-return conductor 120. An end 118a of signal conductor 118 is connected to the other end of resistor 112 and to second end 96b of center signal conductor 96 of transmission line 92.

A further isolation resistor 121, also referred to as an intra-sub-network resistor and having a preferred impedance value of 5,000 ohms, is connected between conductors of sub-network 80 at one end to the circuit node connecting second end 100b of signal conductor 100 of transmission line 94, second end 106b of signal conductor 106, and second end 98b of signal-return conductor 98. The other end of intra-sub-network resistor 121 is connected also between conductors of sub-network 80 to the circuit node connecting second end 96b of signal conductor 96, first end 118a of signal conductor 118, and the associated end of isolating resistor 112.

Second ends 114b, 118b of signal conductors 114, 118 are connected together and to a first end 122a of a center signal conductor 122 of output transmission line 66. Transmission line 66 preferably has an impedance value of 22.34 ohms. Transmission line 66 also includes a signal-return conductor 124 that is an outer shield conductor for transmission line 66 in the form of a coaxial transmission line. A second end 122b of signal conductor 122 is connected directly to circuit node 70. It is seen that combiner 64 combines the signals output from transmission-line sub-networks 78, 80 to a common circuit node proximate to circuit node 70.

It is seen that for the values given, transmission-line network 60 transforms impedance values between circuit node 68, having an impedance value of 50 ohms to an impedance value of 25 ohms on circuit node 70. The input circuit node between filter 72 and transmission-line sub-network assembly 62 sees transmission-line sub-networks 78 and 80 connected in series. Transmission-line sub-network 78 has an impedance value of 31.65 ohms in series with the parallel combination of transmission lines 92, 94, both of which have an impedance value of 31.65 ohms, or 15.83 ohms in combination. The input impedance value on transmission-line sub-network assembly 62 is therefore the sum of the impedance values of the two transmission-line sub-networks, or 47.48 ohms.

The output impedance value on the second end of transmission-line sub-network 92 is also 31.65 ohms, and the output on the second end of transmission-line sub-network 94 is the sum of the series combination of transmission lines 92, 94, or 63.30 ohms. The circuit node at the first end of output transmission line 66 sees the parallel combination of combining transmission lines 108, 110, which has an effective impedance value of about 20.72 ohms.

Figure 4:
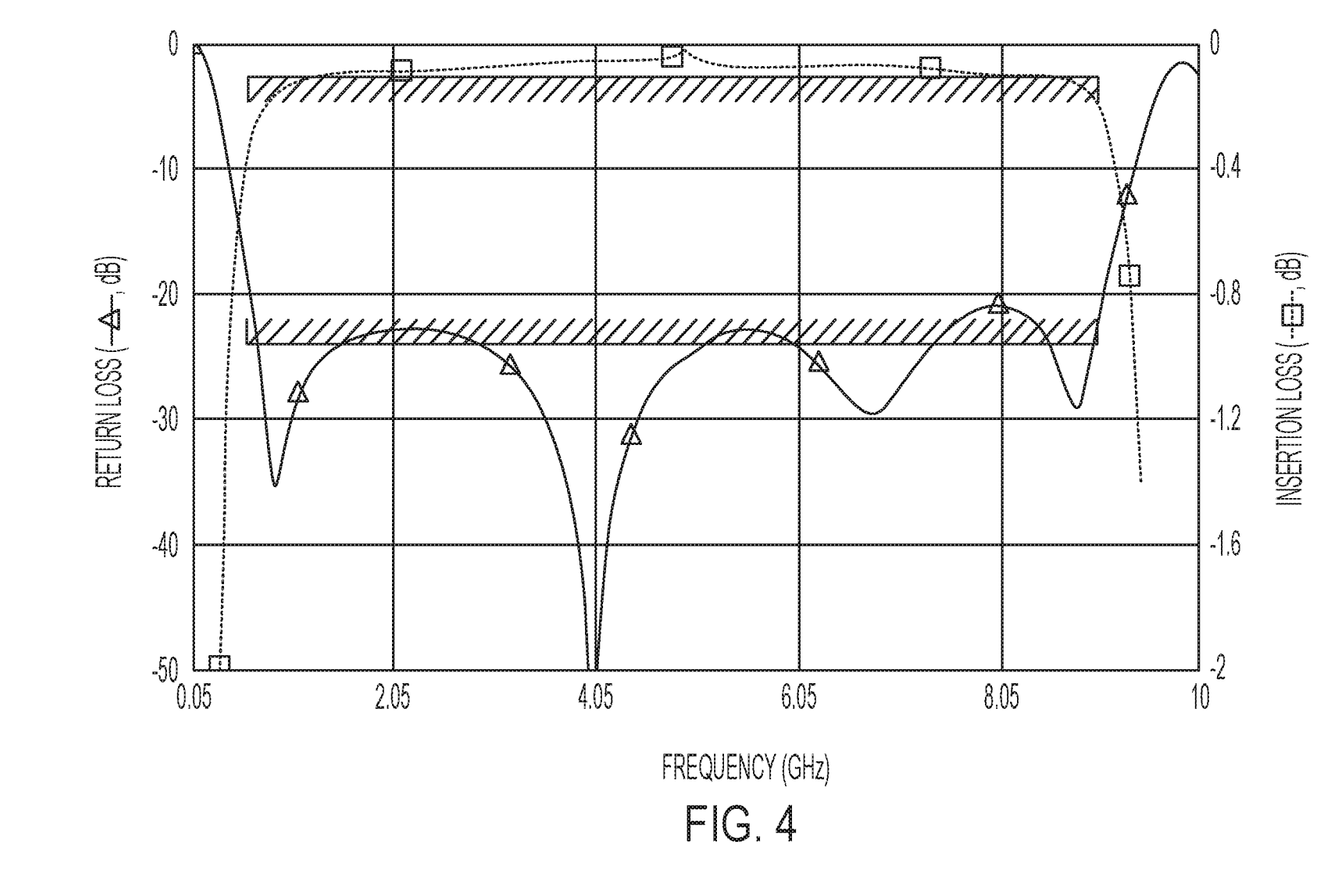
FIG. 4 is a chart showing the frequency response of the transmission-line network of FIG. 3.

FIG. 4 illustrates return loss and insertion loss for transmission-line network 60 over a bandwidth of about 500 MHz to about 9 GHz. It is seen that the insertion loss is about 0.1 dB and the return loss is less than 20 dB.

Example 3

Figure 5:
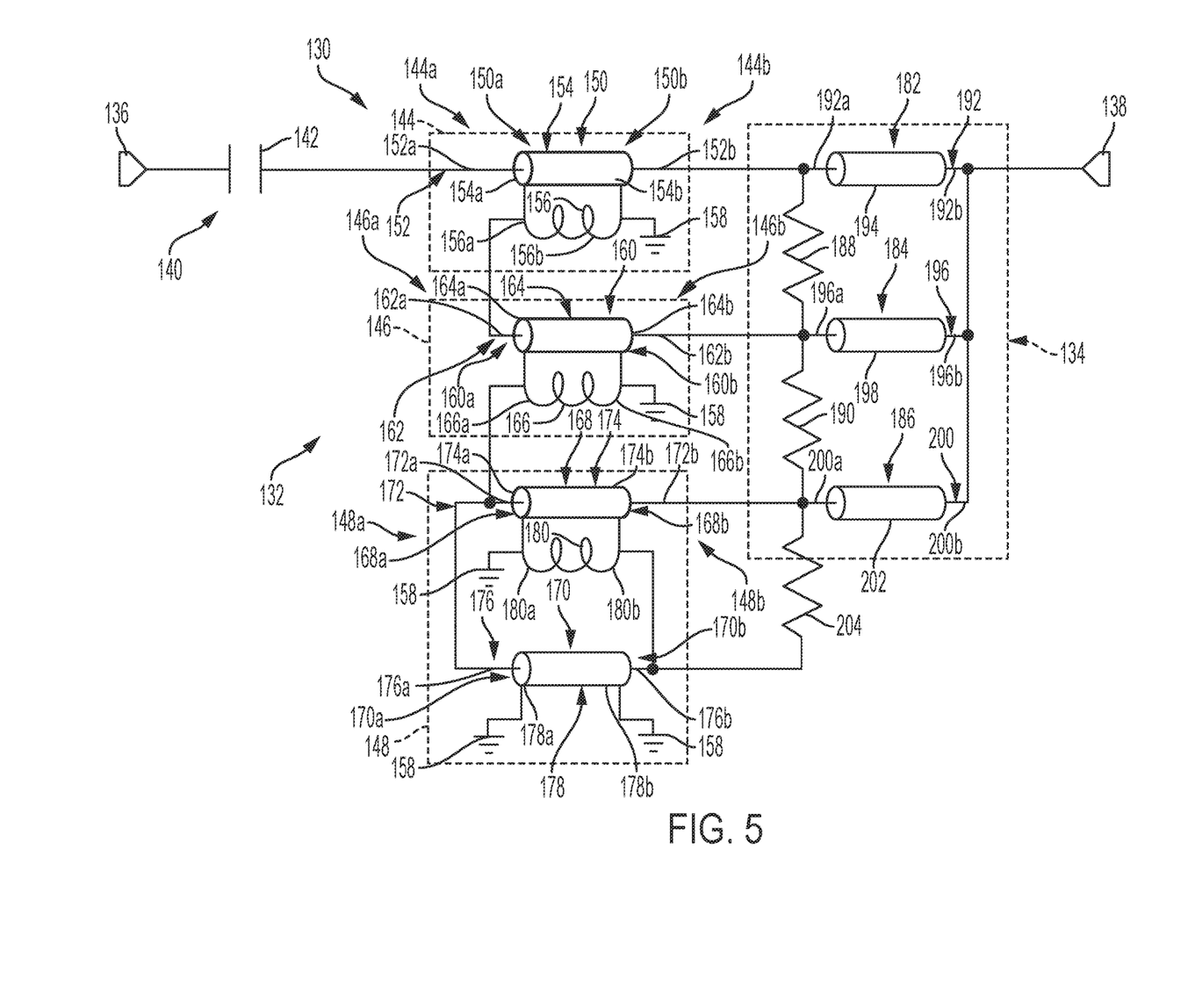
FIG. 5 is a schematic diagram of another example of a transmission-line network according to FIGS. 1 and 2.

A further example of a transmission line network 10 is shown generally at 130 in FIG. 5. It will be seen that transmission-line network 130 includes a transmission-line sub-network assembly 132 and a combiner 134 connected collectively in series between an input circuit node 136, preferably having an input impedance value of 62.5 ohms, and an output circuit node 138, preferably having an output impedance value of 9.8 ohms.

In this example, transmission-line network 130 further includes an input high-pass filter 140. For operation between about 0.1 GHz and 4.0 GHz, filter 140 includes a series capacitor 142 having a preferred capacitance of 82 pF.

Transmission-line sub-network assembly 132 includes a first transmission-line sub-network 144, a second transmission-line sub-network 146, and a third transmission-line subnetwork 148. Transmission-line sub-networks 144, 146, and 148 are examples of generic transmission-line sub-network 40 illustrated in FIG. 2. The ends of the transmission-line sub-networks, associated transmission lines, and associated conductors, proximate to circuit node 136 are referred to a first ends and the ends proximate to circuit node 138 are referred to as second ends.

Transmission-line sub-networks 144, 146 are similar in structure to transmission-line sub-network 78 illustrated in FIG. 3, and transmission-line sub-network 148 is similar in structure to transmission-line sub-network 80. Transmission-line sub-network 144 includes a single transmission line 150 that is shown as a coaxial transmission line having a center, signal conductor 152 and an outer or shield, signal-return conductor 154. First end 152a of signal conductor 152 is connected to input circuit node 136 via filter 140 and first end 154a of signal-return conductor 154 is connected to first end 146a of transmission-line sub-network 146.

An inductor 156, which could be in the form of a lumped component or a distributed component, such as a transmission line conductor, is connected at opposite first and second ends 156a, 156b to corresponding respective ends 154a, 154b of signal-return conductor 154. In this example, inductor 156 preferably has an inductance value of 100 nH. Signal-return conductor 154 and inductor 156 are connected electrically in parallel. Respective second ends 154b and 156b of signal-return conductor 154 and inductor 156 are connected to a circuit ground 158. In this example, transmission line 150 preferably has an impedance value of 25 ohms. Since inductor 156 is in parallel with outer shield signal-return conductor 154 of transmission line 150, it reduces the inductance of transmission line 150 by offsetting inductance of the outer shield signal-return conductor.

Transmission-line sub-network 146 includes a single transmission line 160 that is shown as a coaxial transmission line having a center, signal conductor 162 and an outer or shield, signal-return conductor 164. First end 162a of signal conductor 162 is connected to first end 154a of signal-return conductor 154 and correspondingly to first end 156a of inductor 156, associated with first end 144a of transmission-line sub-network 144. First end 164a of signal-return conductor 164 is connected to first end 148a of transmission-line sub-network 148.

An inductor 166, which can be in the form of a lumped component, as shown, or a distributed component, such as a transmission line conductor, is connected at opposite first and second ends 166a, 166b to corresponding respective ends 164a, 164b of signal-return conductor 164. In this example, inductor 166 preferably has an inductance value of 100 nH. Signal-return conductor 164 and inductor 166 are connected electrically in parallel. Respective second ends 164b and 166b of signal-return conductor 164 and inductor 166 are connected to circuit ground 158. In this example, transmission line 160 preferably has an impedance value of 25 ohms. Since inductor 166 is in parallel with outer shield signal-return conductor 164 of transmission line 160, it reduces the inductance of transmission line 160 by offsetting inductance of the outer shield signal-return conductor.

Transmission-line sub-network 148 includes transmission lines 168, 170 shown as coaxial transmission lines, preferably having impedance values of 25 ohms. Transmission line 168 includes a center signal conductor 172 and an outer shield signal-return conductor 174. Transmission line 170 includes a center signal conductor 176 and an outer shield signal-return conductor 178. First ends 172a and 176a of these signal conductors are connected together and to end 164a of signal-return conductor 164 at first end 160a of transmission line 160, which corresponds to first end 146a of transmission-line sub-network 146. The input ends of transmission lines 168, 170 are thus connected in parallel. Second end 172b of signal conductor 172 is the output at second end 148b of transmission-line sub-network 148.

An inductor 180 is connected at opposite first and second ends 180a, 180b to corresponding respective ends 174a, 174b of signal-return conductor 174. In this example, inductor 180 has an inductance value of 100 nH and transmission line 168 preferably has an impedance value of 25 ohms. Signal-return conductor 174 and inductor 180 are connected electrically in parallel. First ends 174a and 180a of signal-return conductor 174 and inductor 180, respectively, are connected to circuit ground 158. Since inductor 180 is in parallel with signal-return conductor 174, the inductor reduces the inductance of transmission line 168 by offsetting inductance of shield signal-return conductor 174.

Second end 168b of transmission line 168 and second end 180b of inductor 180 are connected to second end 176b of signal line 176 of transmission line 170. First and second ends 178a, 178b of outer shield signal-return conductor 178 are connected to circuit ground 158. It will be appreciated, then, that the second ends of transmission lines 168, 170 are connected from second end 172b of center signal conductor 172 of transmission line 168 in series to ground at second end 178b of outer signal-return conductor 178 of transmission line 170.

Combiner 134 is an example of a combiner 24 having three combining transmission lines 182, 184, 186, shown as coaxial transmission lines, and isolating inter-sub-network resistors 188, 190. Transmission line 182 preferably has an impedance value of 31.2 ohms; transmission line 184 preferably has an impedance value of 19.7 ohms; and transmission line 186 preferably has an impedance value of 53.4 ohms for operation over the design frequency range. Resistor 188 preferably has an impedance value of 11 ohms, and resistor 190 preferably has an impedance value of 33 ohms.

Transmission line 182 includes a center signal conductor 192 and an outer shield signal-return conductor 194. A first end 192a of signal conductor 192 is connected to one end of resistor 188 and to second end 152b of center signal conductor 152 of transmission line 150. A second end 192b of signal conductor 192 is connected to circuit node 138.

Transmission line 184 includes a center signal conductor 196 and an outer shield signal-return conductor 198. A first end 196a of signal conductor 196 is connected to the other end of resistor 188, to one end of resistor 190, and to second end 162b of center signal conductor 162 of transmission line 160. A second end 196b of signal conductor 196 is connected to circuit node 138.

Transmission line 186 includes a center signal conductor 200 and an outer shield signal-return conductor 202. A first end 200a of signal conductor 200 is connected to the other end of resistor 190, to one end of a further isolation resistor 204, and to second end 172b of center signal conductor 172 of transmission line 168. A second end 200b of signal conductor 200 is also connected to circuit node 138. Thus, the second ends of all three of transmission lines 182, 184, 186 are connected to common output circuit node 138.

Isolation resistor 204 is an intra-sub-network resistor having a preferred impedance value of 5,000 ohms, and is connected at one end to the circuit node connecting second end 176b of signal conductor 176 of transmission line 170, second end 180b of inductor 180, and second end 168b of signal-return conductor 168. The other end of resistor 204 is connected to the circuit node connecting second end 172b of signal conductor 172, first end 200a of signal conductor 200, and the associated other end of isolating inter-sub-network resistor 190.

It is seen that for the values given, transmission-line network 60 is nominally a 6:1 impedance transformer, transforming impedance values between circuit node 136, having an impedance value of 62.5 ohms, to an impedance value of 9.8 ohms on circuit node 138. The input circuit node between filter 140 and transmission-line sub-network assembly 130 sees transmission-line sub-networks 144, 146, 148 connected in series. Transmission-line sub-networks 144, 146 have individual impedance values of 25 ohms in series with the parallel combination of transmission lines 168, 170 in transmission-line sub-network 148. Transmission lines 168, 170 each have impedance values of 25 ohms, or a combined impedance at the first end of transmission-line sub-network 148 of 12.5 ohms. The input impedance value on transmission-line sub-network assembly 62 is therefore the sum of the impedance values of the three transmission-line sub-networks, or 62.5 ohms.

The output impedance value on the second end of transmission-line sub-network 148 is the sum of the impedances of the series combination of transmission lines 168, 170, or 50 ohms. Output circuit node 138 sees the parallel combination of combining transmission lines 182, 184, 186, which have a combined effective impedance value of about 9.85 ohms.

Figure 6:
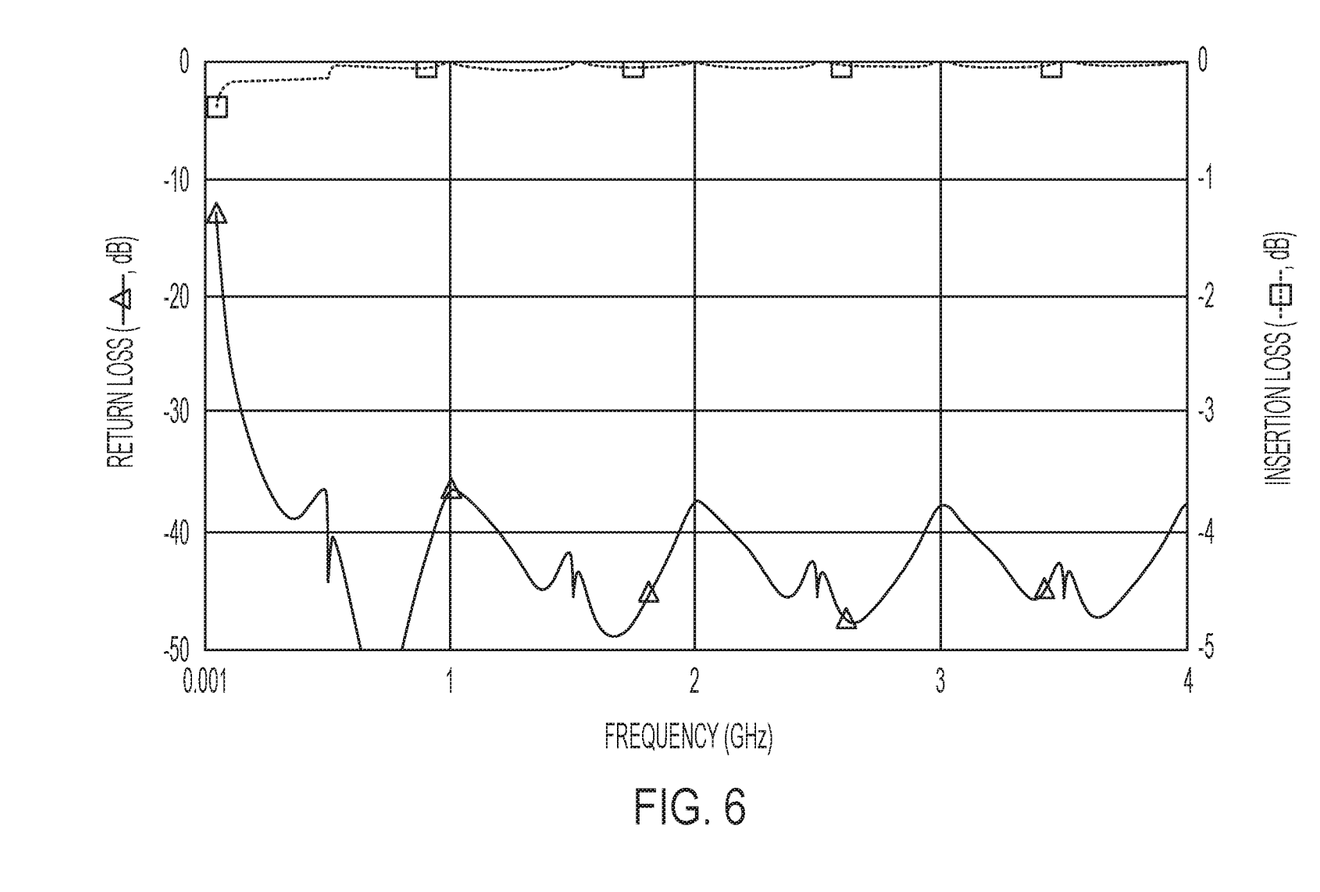
FIG. 6 is a chart showing the frequency response of the transmission-line network of FIG. 5.

FIG. 6 illustrates return loss and insertion loss for transmission-line network 130 over a bandwidth of about 100 MHz to about 4 GHz. It is seen that the insertion loss is very low. The return loss is less than 20 dB for the bandwidth, and above about 500 MHz the return loss is below 35 dB.

Further Examples

This section describes additional aspects and features of transmission-line networks, presented without limitation as a series of paragraphs, some or all of which may be alphanumerically designated for clarity and efficiency. Each of these paragraphs can be combined with one or more other paragraphs, and generally summarize combinations of features disclosed elsewhere in this application. Some of the paragraphs below expressly refer to and further limit other paragraphs, providing without limitation examples of some of the suitable combinations.

A1. A radio-frequency transmission-line network connecting a first circuit node to a second circuit node may comprise a plurality of sub-networks having first and second ends, a respective combining transmission line connecting each sub-network to the second circuit node, and a respective resistor interconnecting second ends of each pair of adjacent subnetworks, wherein each sub-network has at least one sub-network transmission line; the first ends of the plurality of sub-networks are connected directly together electrically in series from the first circuit node; at least one sub-network of the plurality of sub-networks includes a plurality of sub-network transmission lines, including the respective at least one sub-network transmission line, connected together in parallel at the first ends of the sub-network transmission lines associated with the first end of the one sub-network and connected together in series at second ends of the sub-network transmission lines associated with a second end of the one sub-network; and the at least one sub-network has a first-end impedance value that is different than a second-end impedance value of the at least one sub-network, and the second-end impedance value of the at least one sub-network is different than a second-end impedance value of another sub-network of the plurality of sub-networks.

A2. The transmission-line network of paragraph A1, wherein characteristic impedance values of the sub-network transmission lines in the plurality of sub-networks are the same, and characteristic impedance values of at least two of the combining transmission lines are different.

A3. The transmission-line network of paragraph A2, wherein a first respective resistor, interconnecting the second ends of a first pair of the plurality of sub-networks including a first sub-network, has a resistance value that is less than the second-end impedance value of the first sub-network.

A4. The transmission-line network of paragraph A3, wherein a second respective resistor, interconnecting the second ends of a second pair of the plurality of sub-networks including the first sub-network, has a resistance value that is more than the second-end impedance value of the first sub-network.

A5. The transmission-line network of paragraph A1, further comprising a sub-network resistor interconnecting the second ends of first and second transmission lines of the one sub-network.

A6. The transmission-line network of paragraph A5, wherein the sub-network resistor has a resistance value that is more than ten times the characteristic impedance value of the first and second transmission lines of the one sub-network.

A7. The transmission-line network of paragraph A1, wherein a signal-return conductor of the second transmission line of the one sub-network is connected to a circuit ground.

B18. A radio-frequency transmission-line network extending between first and second circuit nodes, the transmission-line network comprising first, second, and third transmission lines, wherein each of the first, second, and third transmission lines has a first end proximate to the first circuit node, a second end proximate to the second circuit node, a length corresponding to a quarter wavelength of a circuit operating radio frequency of the transmission-line network, a signal conductor, and a signal-return conductor, the first circuit node is coupled to the signal conductor at the first end of the first transmission line, the signal-return conductor at the first end of the first transmission line is connected to the signal conductors at the first ends of both of the second and third transmission lines, and the signal-return conductor at the second end of the second transmission line is connected to the signal conductor at the second end of the third transmission line; a fourth transmission line connected between the first transmission line and the second circuit node, wherein a signal conductor at a first end of the fourth transmission line is connected to the signal conductor at the second end of the first transmission line, and the signal conductor at a second end of the fourth transmission line is connected to the second circuit node; a fifth transmission line connected between the second transmission line and the second circuit node, wherein a signal conductor at a first end of the fifth transmission line is connected to the signal conductor at the second end of the second transmission line, and the signal conductor at a second end of the fifth transmission line is connected to the second circuit node; and a first resistor having one end connected to the second end of the first transmission line and another end connected to the second end of the second transmission line.

B2. The transmission-line network of paragraph B1, further comprising sixth and seventh transmission lines and a second resistor, wherein the sixth transmission line has a signal conductor at a first end of the sixth transmission line connected to the first circuit node, a signal-return conductor at the first end of the sixth transmission line is connected to the signal conductor at the first end of the first transmission line, the signal conductor at a second end of the sixth transmission line is connected to a signal conductor at a first end of the seventh transmission line, a second end of the seventh transmission line is connected to the second circuit node, one end of the second resistor is connected to the second end of the sixth transmission line, and another end of the second resistor is connected to the second end of the first transmission line.

B3. The transmission-line network of paragraph B2, wherein the first resistor has a resistance value that is more than a characteristic impedance value of the first transmission line and the second resistor has a resistance value that is less than the characteristic impedance value of the first transmission line.

B4. The transmission-line network of paragraph B3, wherein the fourth transmission line has a characteristic impedance value that is less than the characteristic impedance value of the first transmission line, the sixth transmission line has a characteristic impedance value that is more than the characteristic impedance value of the fourth transmission line, and the fifth transmission line has a characteristic impedance value that is more than the characteristic impedance value of the sixth transmission line.

B5. The transmission-line network of paragraph B1, wherein the first, second, and third transmission lines have characteristic impedance values that are the same, and characteristic impedance values of the fourth and fifth transmission lines are different than the characteristic impedance values of the first, second, and third transmission lines.

B6. The transmission-line network of paragraph B5, wherein the first resistor has a resistance value that is less than a characteristic impedance value of the first transmission line.

B7. The transmission-line network of paragraph B1, further comprising a second resistor interconnecting the second end of the third transmission line with the second end of the second transmission line.

B8. The transmission-line network of paragraph B7, wherein the second resistor has a resistance value that is more than ten times a characteristic impedance value of the third transmission line.

B9. The transmission-line network of paragraph B1, wherein the signal-return conductor of the third transmission line is connected to a circuit ground.

C1. A radio-frequency transmission-line network extending between first and second circuit nodes, the transmission-line network comprising first, second, and third transmission lines having characteristic impedance values that are the same, wherein each of the first, second, and third transmission lines has a first end proximate to the first circuit node, a second end proximate to the second circuit node, a length corresponding to a quarter wavelength of a circuit operating radio frequency of the transmission-line network, a signal conductor, and a signal-return conductor, the first circuit node is coupled to the signal conductor at the first end of the first transmission line, the signal-return conductor at the first end of the first transmission line is connected to the signal conductors at the first ends of both of the second and third transmission lines, the signal-return conductor at the second end of the second transmission line is connected to the signal conductor at the second end of the third transmission line, and the signal-return conductor of the third transmission line is connected to a circuit ground; a fourth transmission line connected between the first transmission line and the second circuit node, wherein a signal conductor at a first end of the fourth transmission line is connected to the signal conductor at the second end of the first transmission line, the signal conductor at a second end of the fourth transmission line is connected to the second circuit node, and the fourth transmission line has a characteristic impedance value that is different than the characteristic impedance value of the first transmission line; a fifth transmission line connected between the second transmission line and the second circuit node, wherein a signal conductor at a first end of the fifth transmission line is connected to the signal conductor at the second end of the second transmission line, the signal conductor at a second end of the fifth transmission line is connected to the second circuit node, and the fifth transmission line has a characteristic impedance value that is higher than the characteristic impedance value of the second transmission line; a first resistor having one end connected to the second end of the first transmission line and another end connected to the second end of the second transmission line, wherein the first resistor has a resistance value that is less than the characteristic impedance value of the first transmission line; and a second resistor interconnecting the second end of the third transmission line with the second end of the second transmission line, wherein the second resistor has a resistance value that is more than ten times the characteristic impedance value of the third transmission line.

C2. The transmission-line network of paragraph C1, further comprising sixth and seventh transmission lines and a third resistor, wherein the sixth transmission line has a signal conductor at a first end of the sixth transmission line connected to the first circuit node, a signal-return conductor at the first end of the sixth transmission line is connected to the signal conductor at the first end of the first transmission line, the signal conductor at a second end of the sixth transmission line is connected to a signal conductor at a first end of the seventh transmission line, the signal conductor at a second end of the seventh transmission line is connected to the second circuit node, one end of the third resistor is connected to the signal conductor at a second end of the sixth transmission line, another end of the third resistor is connected to the signal conductor at the second end of the first transmission line, the sixth transmission line has a characteristic impedance value that is the same as the characteristic impedance value of the first transmission line, the seventh transmission line has a characteristic impedance value that is more than the characteristic impedance value of the sixth transmission line, the characteristic impedance value of the fourth transmission line is less than the characteristic impedance value of the first transmission line, the third resistor has an impedance value that is less than the impedance value of the sixth transmission line, and the first resistor has an impedance value that is more than the impedance value of the first transmission line.

CONCLUSION

The different embodiments of the transmission-line network described herein provide several advantages over known solutions for transforming voltage or impedance over an extended frequency band. For example, the illustrative embodiments of transmission-line networks described have little insertion loss over a wide bandwidth while providing desired impedance transformations. However, not all embodiments described herein provide the same advantages or the same degree of advantage.

The disclosure set forth above may encompass multiple distinct inventions with independent utility. Although each of these inventions has been disclosed in its preferred form(s), the specific embodiments thereof as disclosed and illustrated herein are not to be considered in a limiting sense, because numerous variations are possible. Section headings used within this disclosure are for organizational purposes only and do not constitute a characterization of any claimed invention. The subject matter of the invention(s) includes all novel and nonobvious combinations and subcombinations of the various elements, features, functions, and/or properties disclosed herein. The following claims particularly point out certain combinations and subcombinations regarded as novel and nonobvious. Invention(s) embodied in other combinations and subcombinations of features, functions, elements, and/or properties may be claimed in applications claiming priority from this or a related application. Such claims, whether directed to a different invention or to the same invention, and whether broader, narrower, equal, or different in scope to the original claims, also are regarded as included within the subject matter of the invention(s) of the present disclosure.

The invention claimed is:

1. A radio-frequency transmission-line network connecting a first circuit node to a second circuit node and comprising a plurality of sub-networks having first and second ends, a respective combining transmission line connecting each sub-network to the second circuit node, and a respective inter-sub-network resistor interconnecting second ends of each pair of adjacent subnetworks, wherein:
    each sub-network has at least one sub-network transmission line;
    the first ends of the plurality of sub-networks are connected directly together electrically in series from the first circuit node;
    at least one sub-network of the plurality of sub-networks includes a plurality of sub-network transmission lines, including the respective at least one sub-network transmission line, connected together in parallel at the first ends of the sub-network transmission lines associated with the first end of the one sub-network and connected together in series at second ends of the sub-network transmission lines associated with a second end of the one sub-network; and
    the at least one sub-network has a first-end impedance value that is different than a second-end impedance value of the at least one sub-network, and the second-end impedance value of the at least one sub-network is different than a second-end impedance value of another sub-network of the plurality of sub-networks.

2. The transmission-line network of claim 1, wherein characteristic impedance values of the sub-network transmission lines in the plurality of sub-networks are the same, and characteristic impedance values of at least two of the combining transmission lines are different.

3. The transmission-line network of claim 2, wherein the respective inter-sub-network resistor includes a first inter-sub-network resistor, interconnecting the second ends of a first pair of the plurality of sub-networks including a first sub-network, has a resistance value that is less than the second-end impedance value of the first sub-network.

4. The transmission-line network of claim 3, wherein the respective inter-sub-network resistor further includes a second inter-sub-network resistor, interconnecting the second ends of a second pair of the plurality of sub-networks including the first sub-network, has a resistance value that is more than the second-end impedance value of the first sub-network.

5. The transmission-line network of claim 1, further comprising an intra-sub-network resistor interconnecting the second ends of first and second transmission lines of the one sub-network.

6. The transmission-line network of claim 5, wherein the intra-sub-network resistor has a resistance value that is more than ten times the characteristic impedance value of the first and second transmission lines of the one sub-network.

7. The transmission-line network of claim 1, wherein a signal-return conductor of the second transmission line of the one sub-network is connected to a circuit ground.

8. A radio-frequency transmission-line network extending between first and second circuit nodes, the transmission-line network comprising:
    first, second, and third transmission lines, wherein each of the first, second, and third transmission lines has a first end proximate to the first circuit node, a second end proximate to the second circuit node, a length corresponding to a quarter wavelength of a circuit operating radio frequency of the transmission-line network, a signal conductor, and a signal-return conductor, the first circuit node is coupled to the signal conductor at the first end of the first transmission line, the signal-return conductor at the first end of the first transmission line is connected to the signal conductors at the first ends of both of the second and third transmission lines, and the signal-return conductor at the second end of the second transmission line is connected to the signal conductor at the second end of the third transmission line;

a fourth transmission line connected between the first transmission line and the second circuit node, wherein a signal conductor at a first end of the fourth transmission line is connected to the signal conductor at the second end of the first transmission line, and the signal conductor at a second end of the fourth transmission line is connected to the second circuit node;

a fifth transmission line connected between the second transmission line and the second circuit node, wherein a signal conductor at a first end of the fifth transmission line is connected to the signal conductor at the second end of the second transmission line, and the signal conductor at a second end of the fifth transmission line is connected to the second circuit node; and a first resistor having one end connected to the second end of the first transmission line and another end connected to the second end of the second transmission line.

9. The transmission-line network of claim 8, further comprising sixth and seventh transmission lines and a second resistor, wherein the sixth transmission line has a signal conductor at a first end of the sixth transmission line connected to the first circuit node, a signal-return conductor at the first end of the sixth transmission line is connected to the signal conductor at the first end of the first transmission line, whereby the first circuit node is coupled through the first end of the sixth transmission line to the signal conductor at the first end of the first transmission line, the signal conductor at a second end of the sixth transmission line is connected to a signal conductor at a first end of the seventh transmission line, a second end of the seventh transmission line is connected to the second circuit node, one end of the second resistor is connected to the second end of the sixth transmission line, and another end of the second resistor is connected to the second end of the first transmission line.

10. The transmission-line network of claim 9, wherein the first resistor has a resistance value that is more than a characteristic impedance value of the first transmission line and the second resistor has a resistance value that is less than the characteristic impedance value of the first transmission line.

11. The transmission-line network of claim 10, wherein the fourth transmission line has a characteristic impedance value that is less than the characteristic impedance value of the first transmission line, the sixth transmission line has a characteristic impedance value that is more than the characteristic impedance value of the fourth transmission line, and the fifth transmission line has a characteristic impedance value that is more than the characteristic impedance value of the sixth transmission line.

12. The transmission-line network of claim 8, wherein the first, second, and third transmission lines have characteristic impedance values that are the same, and characteristic impedance values of the fourth and fifth transmission lines are different than the characteristic impedance values of the first, second, and third transmission lines.

13. The transmission-line network of claim 12, wherein the first resistor has a resistance value that is less than a characteristic impedance value of the first transmission line.

14. The transmission-line network of claim 8, further comprising a second resistor interconnecting the second end of the third transmission line with the second end of the second transmission line.

15. The transmission-line network of claim 14, wherein the second resistor has a resistance value that is more than ten times a characteristic impedance value of the third transmission line.

16. The transmission-line network of claim 8, wherein the signal-return conductor of the third transmission line is connected to a circuit ground.

17. A radio-frequency transmission-line network extending between first and second circuit nodes, the transmission-line network comprising:

first, second, and third transmission lines having characteristic impedance values that are the same, wherein each of the first, second, and third transmission lines has a first end proximate to the first circuit node, a second end proximate to the second circuit node, a length corresponding to a quarter wavelength of a circuit operating radio frequency of the transmission-line network, a signal conductor, and a signal-return conductor, the first circuit node is coupled to the signal conductor at the first end of the first transmission line, the signal-return conductor at the first end of the first transmission line is connected to the signal conductors at the first ends of both of the second and third transmission lines, the signal-return conductor at the second end of the second transmission line is connected to the signal conductor at the second end of the third transmission line, and the signal-return conductor of the third transmission line is connected to a circuit ground;

a fourth transmission line connected between the first transmission line and the second circuit node, wherein a signal conductor at a first end of the fourth transmission line is connected to the signal conductor at the second end of the first transmission line, the signal conductor at a second end of the fourth transmission line is connected to the second circuit node, and the fourth transmission line has a characteristic impedance value that is different than the characteristic impedance value of the first transmission line;

a fifth transmission line connected between the second transmission line and the second circuit node, wherein a signal conductor at a first end of the fifth transmission line is connected to the signal conductor at the second end of the second transmission line, the signal conductor at a second end of the fifth transmission line is connected to the second circuit node, and the fifth transmission line has a characteristic impedance value that is higher than the characteristic impedance value of the second transmission line;

a first resistor having one end connected to the second end of the first transmission line and another end connected to the second end of the second transmission line, wherein the first resistor has a resistance value that is less than the characteristic impedance value of the first transmission line; and a second resistor interconnecting the second end of the third transmission line with the second end of the second transmission line, wherein the second resistor has a resistance value that is more than ten times the characteristic impedance value of the third transmission line.

18. The transmission-line network of claim 17, further comprising sixth and seventh transmission lines and a third resistor, wherein the sixth transmission line has a signal conductor at a first end of the sixth transmission line connected to the first circuit node, a signal-return conductor at the first end of the sixth transmission line is connected to the signal conductor at the first end of the first transmission line, whereby the first circuit node is coupled through the first end of the sixth transmission line to the signal conductor at the first end of the first transmission line, the signal conductor at a second end of the sixth transmission line is connected to a signal conductor at a first end of the seventh transmission line, the signal conductor at a second end of the seventh transmission line is connected to the second circuit node, one end of the third resistor is connected to the signal conductor at a second end of the sixth transmission line, another end of the third resistor is connected to the signal conductor at the second end of the first transmission line, the sixth transmission line has a characteristic impedance value that is the same as the characteristic impedance value of the first transmission line, the seventh transmission line has a characteristic impedance value that is more than the characteristic impedance value of the sixth transmission line, the characteristic impedance value of the fourth transmission line is less than the characteristic impedance value of the first transmission line, the third resistor has an impedance value that is less than the impedance value of the sixth transmission line, and the first resistor has an impedance value that is more than the impedance value of the first transmission line.

* * * * *